SUPERCONDUCTIVE CIRCUITS

Filed Dec. 28, 1961

INVENTOR
JERE L. SANBORN

BY Frederick J. Smyth
ATTORNEY

United States Patent Office 3,239,684
Patented Mar. 8, 1966

3,239,684
SUPERCONDUCTIVE CIRCUITS

Jere L. Sanborn, Poughkeepsie, N.Y., assignor to International Business Machines Corporation, New York, N.Y., a corporation of New York Filed Dec. 28, 1961, Ser. No. 162,868
3 Claims. (Cl. 307—88.5)

This invention relates to superconductive circuits and more particularly to improved superconductive circuits employing in-line cryotrons.

The phenomenon of superconductivity, that is the absence of electrical resistivity, which is exhibited by certain materials below predetermined temperatures has been employed in various logical circuits as shown by way of example in U.S. Patent 2,832,897 issued April 29, 1958, to D. A. Buck. As described therein, a basic superconductive switching element, known as a cryotron, consists of a central wire, or gate conductor, about which is wound a single layer coil, or control conductor. The cryotron is then operated at a superconductive temperature such that the gate conductor is normally superconducting. Current flow of at least a predetermined magnitude through the control conductor, known as the critical control current, is thereafter effective to generate a magnetic field, which, when applied to the gate conductor, quenches superconductivity therein so that the gate conductor exhibits normal resistance at the operating superconductive temperature. Further, the control conductor is generally fabricated of a superconductive material having a higher value of critical field than the gate conductor in order that the control conductor remains superconducting for all values of magnetic fields encountered in the operating circuit. Through the interconnection of the gate and control conductors of a number of cryotrons, various amplifiers, oscillators, and logical circuits have been designed which feature low cost, small size, and a high degree of reliability.

Of the many circuits disclosed in the above referenced patent to Buck, a basic logical circuit is the superconducting bistable trigger or flip-flop stage. The trigger, as shown, consists essentially of a pair of superconductor paths electrically connected in parallel. The first path includes a gate conductor of a first cryotron and a control conductor of a second cryotron, and the second path includes the gate conductor of the second cryotron and the control conductor of the first cryotron. Current flow through the first path is indicative that the trigger is in a first stable state and current flow through the second path is indicative that the trigger is in a second stable state. Current supplied to these parallel paths is caused to flow through only one of these paths during any time interval for the reason that current flow through one of the paths destroys superconductivity in the other, and it is well known that current supplied to both a superconducting and a resistive path connected in parallel flows entirely through the superconducting path. Thereafter, current can be directed into one or the other of these paths by momentarily causing the superconducting path to become resistive to initiate a current shift between the paths which cumulatively continues until the original resistive path becomes superconducting. The circuit thereafter maintains the original superconducting path, in which the switch initiating resistance was introduced, in the resistive state until such time as the next switching action is desired. A more complete description is, of course, found in the Buck patent to which reference should be made for more complete information.

Improved cryotron type devices which exhibit faster circuit switching speeds are shown in copending application Serial No. 625,512, filed November 30, 1956, on behalf of Richard L. Garwin and assigned to the assignee of this invention. As there shown, these improved cryotrons are formed of a number of thin films insulated one from the other, wherein a first thin film operates as the gate conductor and one or more other thin films operate as the control conductor, all of these films being supported above and insulated from a superconducting ground plane. These thin film cryotrons are broadly classifiable into two groups. The first of these groups, known as cross film cryotrons, is characterized by one or more control conductors oriented 90° with respect to the gate conductor so that the control conductors traverse the gate conductor. The gain of cross film cryotrons is essentially determined by the ratio of the width of the control conductor portion which crosses the gate conductor to the width of the gate conductor. Thus, the gain of these devices can be increased by narrowing that portion of the control conductor which crosses the gate conductor. The second group of these thin film cryotrons, known as in-line cryotrons, are characterized by having the control conductors, of a width equal to that of the gate conductor, oriented longitudinally parallel with the gate conductor. In this manner, it is possible to introduce a higher value of resistance into the gate conductor for a given current in the control conductor, thereby increasing the circuit switching speed, which is generally defined, when identical cryotrons are employed throughout a set of circuits, as the ratio of the total inductance of the circuit to the resistance exhibited by a single gate conductor when in the resistive state, or more specifically, the circuit $L/R$ ratio. By applying a biasing current to one of the control conductors of an in-line cryotron it is possible to achieve satisfactory operating gain. However, in-line cryotrons are direction sensitive, that is, the maximum current value the gate conductor can carry without this self-current itself quenching superconductivity in the gate, known as the critical gate current, is a function of the magnitude and direction of current flow through the control conductors. Current flow through a control conductor in a direction opposite to the direction of current flow through the gate conductor increases the critical gate current, and current flow through a control conductor in a direction the same as the direction of current flow through the gate conductor reduces the critical current. For this reason, it has been found that the operating gain of an in-line cryotron is determined by the value of control current necessary to maintain the gate conductor resistive in the absence of current flow through the gate conductor, a condition that exists when the circuit current is shifted from the path including the switched gate conductor to an alternate superconducting path.

Now, according to the invention, there is provided novel in-line cryotron circuitry wherein no constant biasing current flow is necessary. Further, the circuit current, shifted from the path including the switch gate conductor, is further employed to complement the action of the set control current such that the value of set control current necessary to switch the gate conductor to the resistive state, and to maintain the gate conductor resistive in the absence of current flow therethrough, is materially decreased. This feature is accomplished by connecting a second control conductor of the in-line cryotron into the path to which the gate current is shifted. In this manner, the decrease in gate current during the switching operation, which normally would require a larger value of control conductor current flow, is compensated by the introduction of the shifted current through the second control conductor so that, during a current shifting operation, the gate conductor is maintained in the resistive state. A further advantage of the in-line cryotron circuitry provided by the invention, is an effective increase in the circuit switching speed wherein the mutual inductance resulting from the portion of the gate current flowing through the second control conductor associated with the gate conductor in the same direction as gate current flow is effective to reduce the total circuit inductance, and, as hereinbefore stated, the *L/R* time constant determines the switching speed of the circuit. This decrease in effective inductance affords increased switching speed. A further advantage of the in-line cryotron circuitry of the invention, which differentiates over the type of circuits shown in the above-referenced Buck patent by way of example, is that it is not necessary or required that resistance be maintained simultaneously in each of the superconductive paths between which the current is shifted. Rather, as more particularly described hereinafter, the supply current is established in a particular superconducting path, and the alternate paths can also be superconducting at this time. Thereafter, the introduction of resistance into the path in which the supply current flows, is effective to shift the supply current into the desired path or paths which, at this instance of time, are completely superconducting.

An object of the invention is to provide improved superconductive logical circuits.

Another object of the invention is to provide improved in-line cryotron circuitry.

A further object of the invention is to provide in-line cryotron circuitry wherein selective positive feedback is employed during a current shifting operation to reduce the magnitude of control current necessary to initiate and maintain the current shifting operation.

Yet another object of the invention is to provide superconductive circuits including in-line cryotrons wherein faster circuit switching time constants are obtained.

Still another object of the invention is to provide cryotron circuitry which employs cryotrons operated on a region of their characteristic curve where the gain is less than one.

Another object of the invention is to provide in-line cryotron circuitry wherein no constant biasing currents are necessary.

The foregoing and other objects, features and advantages of the invention will be apparent from the following more particular description of preferred embodiments of the invention, as illustrated in the accompanying drawings.

Figures 1, 2:
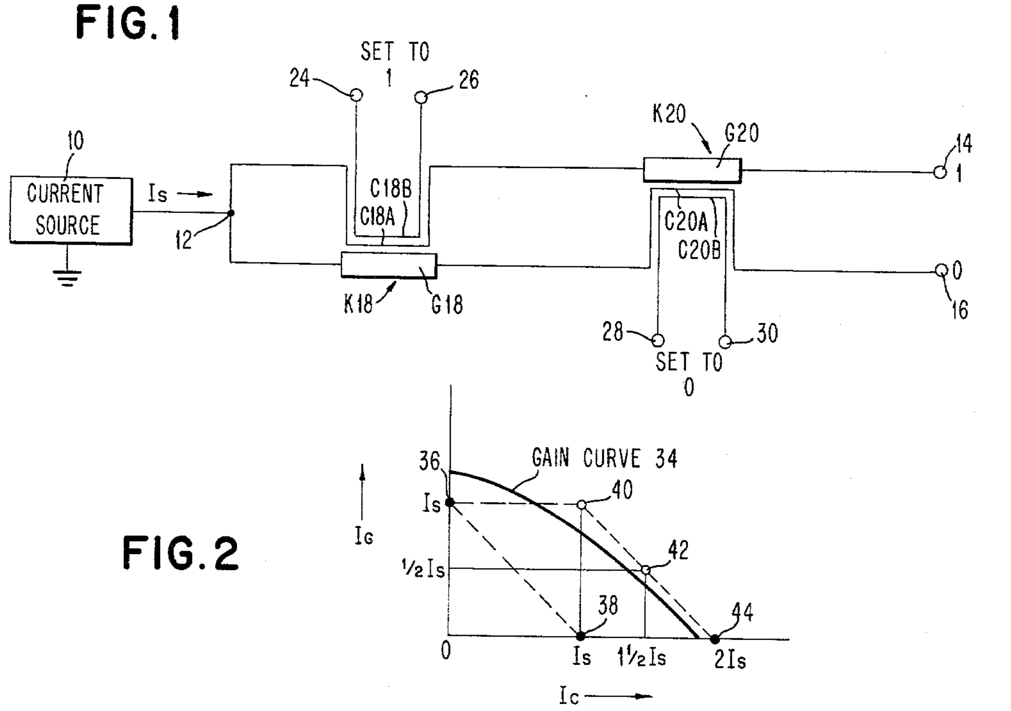
FIG. 1 is a schematic diagram of a trigger circuit according to the invention.
FIG. 2 is a gain curve of the in-line cryotron circuitry of the invention which illustrates a dynamic current shifting operation.

Referring now to the drawings, FIG. 1 illustrates a trigger circuit according to the invention. As shown therein, a current $I_s$ from a constant current source 10 is delivered to a junction 12 and then flows to one of a pair of output terminals 14 and 16. Arbitrarily, terminal 14 is selected to indicate the value of 1 and terminal 16 is chosen to represent the value 0, in the well known binary information representation system. The first path from terminal 12 includes a gate conductor G18 of cryotron K18 and a first control conductor C20A of cryotron K20. The second of the parallel paths includes a first control conductor C18A of cryotron K18 and gate conductor G20 of cryotron K20. The magnitude of current $I_s$ is selected such that flowing through either gate conductor G18 or gate conductor G20, $I_s$, of and by itself, is insufficient to quench superconductivity in the gate conductors, and, further, $I_s$ flowing through control conductors C18A or C20A is also insufficient to quench superconductivity in gate conductors G18 and G20, respectively, associated therewith in the absence of gate current flow. In this manner, current $I_s$ established in either one of these parallel paths is insufficient to quench superconductivity therein so that the path remains superconducting, and, further, this current flow through the established path is insufficient of and by itself to introduce resistance in the other parallel path. Thus, during static operations, without any current in the control conductor, each of the first and second paths remain completely superconducting at the chosen operating temperature. For illustrative purposes assume the current $I_s$ from source 10 to be established in the binary 0 representing path, that is $I_s$ flows to terminal 12 and then through gate G18 and control C20A to terminal 16. Next, to shift the current to the binary 1 representing path, a set current, by way of example equal in value to $I_s$, is applied between a pair of terminals 24 and 26 to flow through a control conductor C18B of cryotron K18 in the same direction as current $I_s$. This set current flow, flowing through gate G18, together with the current from source 10 flowing through gate G18, is sufficient to quench superconductivity in gate G18 and the current $I_s$ from source 10 begins to shift into the binary 1 representing path. This portion of $I_s$ shifted to the binary 1 path flows through control conductor C18A in the same direction as the remaining portion of $I_s$ flowing through G18 and is effective, in conjunction with the current flow through control C18B, to maintain gate conductor G18 is the resistive state. This current shift from the binary 0 into the binary 1 path is cumulative until all of the current $I_s$ from source 10 flows in the binary 1 path. At this time, with no current flowing through gate G18, the value of the current $I_s$ from source 10 flowing through control C18A together with the set current, equal in value to $I_s$, flowing through control C18B is effective to maintain gate G18 in the resistive state. Next, the set to 1 current applied to terminals 24 and 26 is terminated, and gate G18 again switches to the superconducting state since current $I_s$ flowing through control C18A is, as stated above, insufficient by itself to maintain gate G18 in the resistive state. At this time although gate G18 again is superconducting so that the binary 0 representing path is completely superconducting, the current established in the binary 1 representing path continues to flow therethrough, since no voltage or other force is effective to shift the current out of the established path.

In order to return the circuit of FIG. 1 to the binary 0 representing state, a set current is applied between a pair of terminals 28 and 30 which again has a value, by way of example, equal to $I_s$. This current flow through a second control conductor C20B of cryotron K20 in the same direction as current $I_s$ flowing through gate G20 is sufficient, in combination therewith, to quench superconductivity in gate G20. Next, a current shift operation is initiated with the current $I_s$ shifting from the binary 1 representing path into the binary 0 representing path. The decreased magnitude of current through gate G20 tends to allow this gate to return to a superconducting state; however, the shifted portion of $I_s$ now flowing through control conductor C20A in the same direction as the remaining portion of $I_s$, is effective, in combination with the set current flow through control C20B, to maintain gate G20 in the resistive state. At the end of the current shifting operation, with no current flow through gate G20, this gate remains in the resistive state as a result of current $I_s$ flowing through control C20A together with the set to 0 current flowing through control C20B. Next, the set for 0 current is terminated and gate G20 again returns to the superconducting state since the value of $I_s$ flowing through control C20A is insufficient by itself to maintain gate G20 in the resistive state. It is thus seen that, except for those periods of time when set currents are applied to either terminal pair 24, 26 or terminal pair 28 and 30, the binary 1 and the binary 0 representing paths each are completely superconducting. This, by itself, is an important concept since in triggers of the prior art, as for example, the elementary trigger circuit shown in the above-referenced Buck patent, current flow through one of the parallel paths is effective to introduce resistance in the other of the parallel paths; a circuit arrangement which is generally known as a cross-latch connection. That is, current flow through one of the paths which itself is superconducting is effective to maintain the parallel path in the resistive state. Thus, at the beginning of a switching operation in the circuits of the prior art, when resistance is first introduced into the superconducting path, each of the parallel paths are resistive resulting in a supply current tending to divide equally between the paths rather than all of the current tending to shift from the resistive path into a parallel superconducting path. Thus, this feature alone is effective to provide a faster current shift, since all of the current initially tends to shift into the selected path. Further, switching speed is additionally increased as a result of the mutual inductive coupling between the control and gate conductors being advantageously employed to decrease the magnitude of circuit inductance. Thus, the decrease in gate conductor current, such as the decrease in current flow through gate G18 when a circuit is shifted to the binary 1 representing state, is opposed by the increasing current flow, in the same direction, through the associated control conductor, in this example, control C18A. In this manner, the increasing and decreasing currents generate increasing and decreasing magnetic fields which are mutually coupled, and the decreased magnitude of changing magnetic field reduces the effective circuit inductance, and since the effective circuit inductance is directly proportional to circuit time constant, this reduced inductance is effective to reduce the circuit time constant.

For more complete understanding of the current shift operation described immediately above, reference should now be had to FIG. 2. FIG. 2 illustrates by means of a curve 34, the transition characteristics of a typical in-line cryotron as a function of both the gate and control currents. The gate conductor is superconducting for all combinations of these currents which define points lying below curve 34 and the gate conductor is resistive for all combinations of these currents defining points lying above curve 34. Thus, with no current supplied to the control conductors of the cryotron and the gate conductor carrying a current of magnitude $I_s$, a point 36 is defined which indicates the gate conductor is superconducting. Further, in the absence of gate conductor current the energization of a control conductor by current $I_s$ defines a point 38 such that the gate conductor is still superconducting as explained in the operation of the circuit of FIG. 1. However, with the gate conductor carrying a current $I_s$, a further value of current equal to $I_s$ flowing through the control conductor now defines a point 40 which, lying above curve 34, indicates that this combination of currents together is effective to quench superconductivity in the gate conductor. Referring again to the circuit of FIG. 1, when the gate conductor in one of the paths becomes resistive the current conducted thereby begins to shift into the other of the parallel paths thereby decreasing the current flow through the gate conductor. As shown in FIG. 2, the decrease of value of current through the gate conductor by itself tends to allow this conductor to again become superconducting, thereby terminating the current shift operation. However, with the novel circuitry illustrated in FIG. 1, the gate conductor is always maintained in the resistive state when the current $I_s$ is applied to one of the control conductors. This is clearly seen in FIG. 2, for when the gate conductor current has decreased in value to ½ $I_s$, by way of example, representing a current shift of ½ $I_s$ to the other of the parallel paths, this additional current flowing through a second control conductor increases the total effective control conductor current 1½ $I_s$ and these currents define a point 42 in FIG. 2, which lies above curve 34. Thus, during a current shift operation, the effective control current applied to the gate conductor is always of sufficient magnitude to maintain the gate conductor in the resistive state. Finally, when all the current has been shifted out of the gate conductor the effective control conductor current is now 2 $I_s$, defining a point 44 in FIG. 2 which again lies above curve 34. In summary then, the application through a control conductor of a current equal in magnitude of $I_s$ to a cryotron wherein the gate conductor is initially carrying a current also equal in magnitude to $I_s$ quenches superconductivity in the gate and, during the current shifting operation, the total effective control conductor current, together with the gate conductor current, defines a line between points 40 and 44 in FIG. 2 every point of which lies above curve 34 such that the gate conductor is always maintained in the resistive state as the gate current decreases from $I_s$ to 0.

Figure 3:
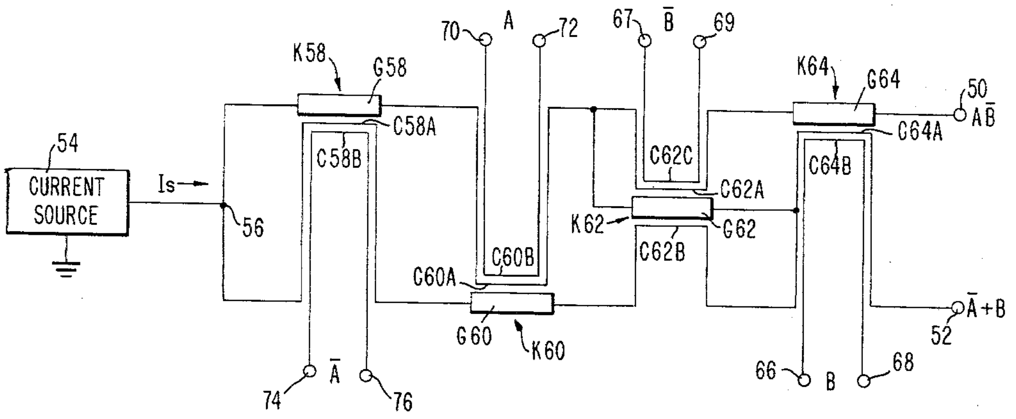
FIG. 3 is a schematic diagram of a logical circuit according to the invention.

Referring now to FIG. 3, there is shown a second embodiment of the in-line cryotron circuitry of the invention wherein a more complicated logical operation is performed. The circuit of FIG. 3 is effective to indicate the function $A\overline{B}$ by current flow to a terminal 50, or, alternatively, the function $\overline{A}+B$ by current flow to terminal 52. Current is supplied to either of terminals 50 and 52 from a current source 54 which delivers a current, having a value $I_s$, to a terminal 56. From terminal 56 the current flows through either one of a number of parallel paths, the first of which includes a gate conductor G58 of a cryotron K58, a control conductor C60A of a cryotron K60, a control conductor C62A of a cryotron K62 and a gate conductor G64 of a cryotron K64. A second path includes a control conductor C58A of cryotron K58, a gate conductor G60 of cryotron K60, a control conductor C62B of cryotron K62 and a control conductor C64A of cryotron K64. Additionally, a bridging path consisting of a gate conductor G62 is provided between the first and second paths. The logical signals A, $\overline{A}$, B and $\overline{B}$ are selectively applied through control conductors C60B, C58B, C64B, and C62C to direct the current from source 54 to either of terminals 50 or 52 in accordance with the applicable logical truth table.

The circuit of FIG. 3 is essentially similar in operation to that of the circuit illustrated in FIG. 1. Again, as in FIG. 1, the direction of current flow through the various conductors is the same as the direction of current flow through the associated gate conductors, during each of the switching operations described below. The application of function B to the circuit of FIG. 3 is effective to deliver one unit of current, equal in magnitude to current $I_s$, to terminals 66 and 68 and through control conductor C64B and this current is sufficient to drive gate G64 resistive. That this occurs can be seen from the fact that current $I_s$, from source 54, must of necessity flow either through gate G64 itself, or, alternatively, through control conductor C64A. Under the first condition, that is, current $I_s$ flows at this time through gate conductor G64, the summation of this current flow and the current flow through control conductor C64B is sufficient to switch gate G64 resistive, in the same manner as above described with reference to FIG. 1, and, further, the shifted portion of $I_s$, resulting from the now resistive gate G64, flows through control conductor C64A to maintain this gate resistive as the gate current decreases to zero. Under the second condition, that is, current $I_s$ flows through control conductor C64A, the summation of these two control conductor currents, effectively equal in magnitude to $2I_s$, by itself is sufficient to switch gate G64 to the resistive state. Thus, the application of function B is effective to determine that gate G64 is resistive and that current $I_s$ flows through C64A. Also at this time gate G62 remains superconducting since the absence of the corresponding logical function $\overline{B}$ to terminal pair 67–69 as a result of the presence of the logical function B maintains control C62C de-energized and current $I_s$ from source 54, flowing through either gate G62 or controls C62B, is not sufficient of itself to quench superconductivity in gate G62. Next, the application of logical function A to the circuit of FIG. 3 supplies a unit current, equal in magnitude to $I_s$, to terminals 70 and 72 and through control C60B, is effective to switch gate G60 to the resistive state. This occurs as a result of current $I_s$, from source 54, flowing either through control C60A or gate G60, and this current combination is sufficient to quench superconductivity in gate G60, as hereinabove described. Under this condition, that is, with the functions A and B both simultaneously applied, current $I_s$ from source 54 flows through gate G58, control C60A, gate G62, and control C64A to terminal 52, and if previously established through gate G64 to terminal 50, is shifted therefrom through gate G62 to terminal 52. Continuing now with the above example, wherein logical function B is applied to the circuit of FIG. 3, the application of the logical function $\overline{A}$ to terminal pair 74 and 76 and through control C58B is sufficient to render gate G58 resistive in conjunction with current $I_s$ from the source 54 flowing either through gate G58 itself or through control C58A. In this manner, the current from source 54 is directed to the second of the parallel paths and along this path to terminal 52. Summarizing the above, the application of the logical function B is effective to direct current from source 54 to terminal 52, independent of the state of the logical function A. The current is directed to terminal 50 only by the simultaneous application of the logical functions A and $\overline{B}$, which defines the unique superconducting path determined by gate G58, control C60A, gate G62, and control C64A.

It should now be understood that the circuit of FIG. 3 is similar in operation to that described above with reference to FIG. 1. Included in FIG. 3 is a somewhat more complicated in-line cryotron K62 wherein three control conductors are included. However, as has been described, the operation of this cryotron is similar to the other cryotrons in the circuit. Further it should be emphasized that although multiple control cryotrons are included in each of the circuits of FIGS. 1 and 3, it has been experimentally verified that a unit current flow through any of the control conductors of a multiple control in-line cryotron has essentially the same influence on the transition characteristics of the gate conductor. It is this feature which allows a smaller value of set current to be coupled to a first control conductor, which value is insufficient to maintain the gate conductor resistive in the absence of current flow through the gate conductor, and, thereafter, employing the current shifted from the path including the now resistive gate conductor through a second control conductor so that the summation of the control conductor currents, that is, the applied set control current and the shifted gate current, together function to maintain the associated gate conductor resistive even when the gate conductor current has been reduced to 0.

Note should be made of the fact that although throughout the detailed descriptions of the several embodiments of the invention, the setting current applied to a control conductor has been chosen equal in magnitude to the value of gate conductor current, this has been done for ease in understanding the invention only, it being understood that the magnitude of the setting current may be less than the gate current provided only that the sum of the gate and setting currents is sufficient to maintain the gate resistive in the absence of current flow through the gate conductor. Finally note should be made of the fact that the various embodiments of the superconductive circuitry disclosed herein must of necessity operate at a superconductive temperature which is generally close to absolute 0. However, for the reason that the means for obtaining and maintaining these superconductive temperatures is standard in the art these means have neither been shown or described herein.

While the invention has been particularly shown and described with reference to preferred embodiments thereof, it will be understood by those skilled in the art that various changes in form and details may be made therein without departing from the spirit and scope of the invention.

What is claimed is:

1. A superconductive circuit comprising a plurality of in-line cryotrons interconnected to define a plurality of parallel superconducting paths, each of said cryotrons including a gate conductor connected in the associated path and a plurality of control conductors associated with the gate conductor; each control conductor being positioned parallel to its respective gate conductor so as to apply, when carrying current, a transverse magnetic field to its associated gate conductor;

means for supplying a particular amount of current to said parallel paths; and input means selectively operable to energize a first control conductor of selected cryotrons, said energized control conductor being effected to quench superconductivity of the associated gate and thereby shift current into another superconducting path if the associated gate conductor is carrying current, all of said paths including a second control conductor for each of said gate conductors;

said particular amount of current flow through any of said second control conductors being ineffective of and by itself to quench superconductivity in the associated gate conductor;

whereby said input means quenches the superconductivity of a particular gate conductor initiating a shift of current between parallel paths and after the shift has been initiated it is aided by the current in the second control conductor of the particular gate.

2. A superconductive circuit comprising first and second superconductive paths connected in parallel;

means maintaining said circuit at a temperature at which said first and second paths are each normally superconducting;

first and second in-line cryotrons each having a gate conductor and first and second control conductors; said in-line configuration requiring that a control conductor be positioned parallel to its respective gate conductor so as to apply, when carrying current, a transverse magnetic field to its associated gate conductor, said first path including said gate conductor of said first in-line cryotron and said first control conductor of said second in-line cryotron, said second path including said gate conductor of said second in-line cryotron and said first control conductor of said first in-line cryotron;

a current source;

means coupling said current source to said first and second paths, said source delivering a current to said paths having a value when flowing through either of said first and second paths which is less than the critical current of each of said gate conductors and being ineffective of and by itself to quench superconductivity in a gate conductor when flowing through the first control conductor thereof, second and third current sources for selectively delivering current to said second control conductors of said first and second cryotrons respectively, whereby current from said second or third source together with current flow through a particular one of said gate conductors quenches superconductivity in said particular gate conductor to thereby shift current flow from said first source from the path including said particular gate conductor to the path including the other of said gate conductors, and said shifted current together with current from said second or third source thereafter being effective to maintain said one gate conductor resistive.

3. A superconductive circuit comprising a first and second in-line cryotron, each of said cryotrons including a gate conductor and a plurality of control conductors; said in-line configuration requiring that a control conductor be positioned parallel to its respective gate conductor so as to apply, when carrying current, a transverse magnetic field to its associated gate conductor, means for interconnecting said cryotrons to provide first and second parallel superconductive paths, each of said paths including the gate conductor of one of said cryotrons and a control conductor of the other of said cryotrons;

a constant current source coupled to said parallel first and second paths; current from said source having a magnitude which, when flowing through said first or second paths, is ineffective of and by itself to introduce resistance into either of said first and second paths;

means maintaining said circuits at a superconductive temperature at which said first and second paths are normally superconducting;

first set means connected to a control conductor of said first cryotron for supplying sufficient current to said control conductor to quench the superconductivity of the associated gate conductor when the current from said current source is flowing therethrough; and second set means connected to a control conductor of said second cryotron for supplying sufficient current to said control conductor to quench the superconductivity of the associated gate conductors when the current from said current source is flowing therethrough.

References Cited by the Examiner

UNITED STATES PATENTS

| | | | |
|---|---|---|---|
| 2,969,469 | 1/1961 | Richard | 307—88.5 |
| 3,001,179 | 9/1961 | Slade | 307—88.5 |
| 3,062,968 | 11/1962 | McMohon | 307—88.5 |
| 3,065,359 | 11/1962 | Mackay | 307—88.5 |

ARTHUR GAUSS, *Primary Examiner.*

JOHN W. HUCKERT, *Examiner.*